US007279956B2

(12) United States Patent
Caplan et al.

(10) Patent No.: US 7,279,956 B2
(45) Date of Patent: Oct. 9, 2007

(54) SYSTEMS AND METHODS FOR MINIMIZING STATIC LEAKAGE OF AN INTEGRATED CIRCUIT

(75) Inventors: Randy J. Caplan, San Jose, CA (US); Steven J. Schwake, San Jose, CA (US)

(73) Assignee: MOSAID Technologies Incorporated, Kanata (CA)

( * ) Notice: Subject to any disclaimer, the term of this patent is extended or adjusted under 35 U.S.C. 154(b) by 42 days.

(21) Appl. No.: 10/996,739

(22) Filed: Nov. 24, 2004

(65) Prior Publication Data
US 2006/0006929 A1    Jan. 12, 2006

Related U.S. Application Data

(60) Provisional application No. 60/586,565, filed on Jul. 9, 2004.

(51) Int. Cl.
*G05F 1/10* (2006.01)
(52) U.S. Cl. ..................................... 327/536
(58) Field of Classification Search .............. 327/534, 327/536, 544
See application file for complete search history.

(56) References Cited

U.S. PATENT DOCUMENTS 6,021,056 A * 2/2000 Forbes et al. .................. 363/60
6,198,342 B1 * 3/2001 Kawai ......................... 327/536

OTHER PUBLICATIONS

U.S. Appl. No. 10/840,893, filed May 7, 2004, Barry Alan Hoberman, Managing Power on Integrated Circuits Using Power Islands.

* cited by examiner

*Primary Examiner*—Jeffrey Zweizig
(74) *Attorney, Agent, or Firm*—Carr & Ferrell LLP

(57) ABSTRACT

To minimize static leakage of an integrated circuit, a charge pump generates a negative voltage to be applied to a "sleep" transistor cascaded to a logic gate of the integrated circuit. An adaptive leakage controller determines continuously or periodically whether to adjust the negative voltage to minimize the static leakage. A negative voltage regulator adjusts the negative voltage depending on the determination. Some embodiments determine whether to adjust the negative voltage by monitoring one or more parameters of the sleep transistor. Some embodiments determine whether to adjust the negative voltage by monitoring one or more parameters of an emulated sleep transistor.

6 Claims, 8 Drawing Sheets

SYSTEMS AND METHODS FOR MINIMIZING STATIC LEAKAGE OF AN INTEGRATED CIRCUIT

CROSS-REFERENCE TO RELATED APPLICATIONS

This application claims the benefit of U.S. Provisional Application No. 60/586,565 titled "Systems and Methods for I/O and Power Island Management and Leakage Control on Integrated Circuits," filed Jul. 9, 2004, which is hereby incorporated by reference. This application is also related to U.S. patent application Ser. No. 10/840,893, titled "Managing Power on Integrated Circuits Using Power Islands," filed May 7, 2004, which is hereby incorporated by reference.

BACKGROUND

1. Field of the Invention

The present invention relates generally to integrated circuits, and more particularly to systems and methods for applying a negative voltage in integrated circuits.

2. Description of the Prior Art

One design goal for integrated circuits is to reduce power consumption. Devices with batteries such as cell phones and laptops particularly need a reduction in power consumption in the integrated circuit to extend the life of the battery. Additionally, a reduction in power consumption prevents overheating and lowers the heat dissipation of the integrated circuit, which in some cases eliminates or simplifies heat sinks and/or fans required to cool the integrated circuit. As well, the reduction in power consumption of the integrated circuit reduces the AC power draw for the device containing the integrated circuit.

A competing design goal for integrated circuits is increased performance. One way to increase performance is by increasing a maximum operating frequency of a circuit. In order to increase the maximum operating frequency of a circuit, or to integrate more functionality in a smaller area, integrated circuit manufacturing technology shrinks the device size of individual components (e.g. transistors) on the integrated circuit.

However, as component device size scales from 250 nanometers to 130 nanometers or below, a current draw of a device in standby mode referred to as static leakage becomes an increasingly large part of the power budget of the integrated circuit. For example, simulations show that, for an integrated circuit dissipating 50 watts constructed using 130 nanometer devices, greater than 20 percent of the power dissipated is due to static leakage. For even smaller devices, simulations show that the static leakage of an integrated circuit using 50 nanometer feature sizes comprises about 50 percent of the total power budget.

One solution for reducing static leakage includes use of one or more sleep transistors coupled to a logic gate of the integrated circuit. Application of a control signal to the sleep transistor may reduce the static leakage of the logic gate.

SUMMARY OF THE INVENTION

A system for minimizing static leakage of an integrated circuit comprises a charge pump, an adaptive leakage controller, and a negative voltage regulator. The charge pump generates a negative voltage to be applied to a sleep transistor. The sleep transistor is configured to control the static leakage of a logic gate of the integrated circuit. In some embodiments, the logic gate may be located in a power island of the integrated circuit. The adaptive leakage controller determines whether to adjust the negative voltage to minimize the static leakage. The adaptive leakage controller may continuously or periodically determine whether to adjust the negative voltage. The negative voltage regulator adjusts the negative voltage depending on the determination.

A method for minimizing static leakage of the integrated circuit comprises generating the negative voltage, applying the negative voltage to the sleep transistor, determining whether to adjust the negative voltage to minimize the static leakage, and adjusting the negative voltage depending on the determination. The method may comprise controlling static leakage of the logic gate of the integrated circuit with the sleep transistor. The method may comprise monitoring one or more parameters of the sleep transistor.

One advantage of the invention is that because the adaptive leakage controller determines whether to adjust the negative voltage, static leakage is minimized with changes in operating temperature of the integrated circuit, or with voltage fluctuations or manufacturing variations. Rather than a fixed negative voltage, the negative voltage applied to the sleep transistor is adjusted to minimize the static leakage. A further advantage is that single threshold transistor circuitry may be utilized in the integrated circuit, reducing the complexity of the manufacturing process for the integrated circuit. A still further advantage is that the negative voltage may be generated within the integrated circuit, obviating components external to the integrated circuit for generating the negative voltage.

DETAILED DESCRIPTION OF THE INVENTION

Figure 1:
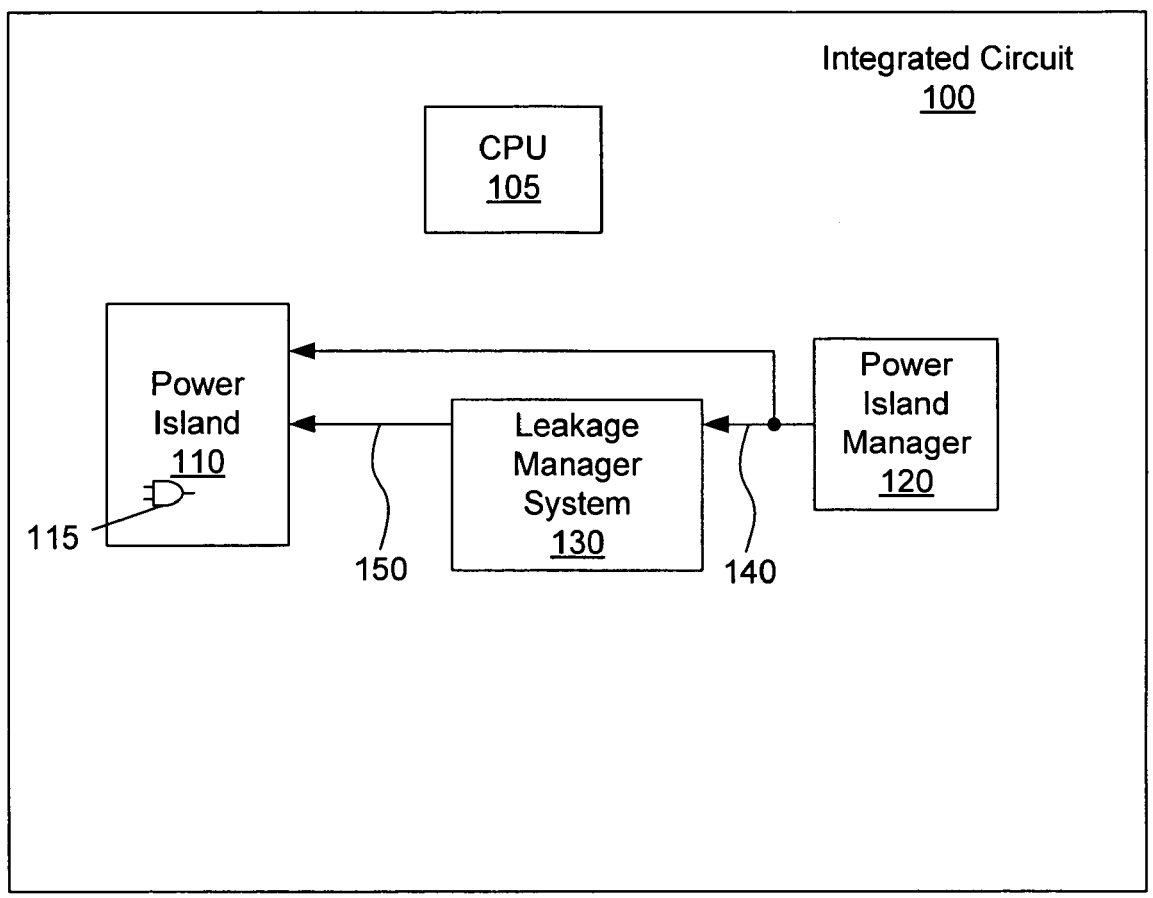
FIG. 1 is a block diagram of an integrated circuit embodying a system for minimizing static leakage, in accordance with one embodiment of the invention.

As shown in the exemplary drawings wherein like reference numerals indicate like or corresponding elements among the figures, exemplary embodiments of a system and method according to the present invention are described below in detail. It is to be understood, however, that the present invention may be embodied in various forms. For example, although described herein as pertaining to minimizing static leakage of an integrated circuit, aspects of the invention may be practiced on circuitry not embodied within an integrated circuit. Therefore, specific details disclosed herein are not to be interpreted as limiting, but rather as a basis for the claims and as a representative basis for teaching one skilled in the art to employ the present invention in virtually any appropriately detailed system, structure, method, process or manner.

FIG. 1 is a block diagram of an integrated circuit 100 embodying a system for minimizing static leakage, in accordance with one embodiment of the invention. The integrated circuit 100 is any electronic device that is instantiated into silicon and/or similar manufacturing materials. One example of the integrated circuit 100 is a system-on-a-chip. The integrated circuit 100 includes multiple intellectual property (IP) units, which are blocks of circuitry performing specific functions. It will be appreciated that functions of the integrated circuit 100 described herein may be performed by a single integrated circuit 100 or may be partitioned among several integrated circuits 100. The exemplary integrated circuit 100 of FIG. 1 includes a central processor unit (CPU) 105, one or more power islands 110, one or more power island managers 120, and one or more leakage manager systems 130.

While FIG. 1 depicts one power island 110 and one power island manager 120 for the sake of simplicity, other embodiments of the integrated circuit 100 may include any number of power islands 110, power island managers 120, and leakage manager systems 130. In such embodiments, some of the power islands 110 may comprise different circuitry with respect to other power islands 110. The power island 110 and the power island manager 120 are further described in co-pending U.S. patent application Ser. No. 10/840,893, entitled "Managing Power on Integrated Circuits Using Power Islands," filed May 7, 2004.

The power island 110 is any section, delineation, partition, or division of the integrated circuit 100 in which power consumption is controlled. In some embodiments, multiple power islands 110 are delineated based on geographical factors of the integrated circuit 100. In some embodiments, multiple power islands 110 are delineated based on functional IP units of the integrated circuit 100. In some embodiments, the power island 110 comprises sub-islands of power to provide further specificity in controlling power in the integrated circuit 100. In some embodiments, each of multiple power islands 110 includes power control circuitry to control power within the power island 110.

The power island manager 120 is any circuitry, device, or system to determine a target power level for one of the power islands 110, determine an action to change a consumption power level of the one of the power islands 110 to the target power level, and perform the action to change the consumption power level of the one of the power islands 110 to the target power level. The power island manager 120 can thus dynamically change the power consumption of the power islands 110 based on the needs and operation of the integrated circuit 100. The target power level is a desired, calculated, or specified power consumption of the power islands 110. The power island manager 120 may be a hierarchy or group of power island managers 120.

While FIG. 1 depicts one leakage manager system 130 coupled to one power island manager 120 for the sake of simplicity, some embodiments comprise a plurality of leakage manager systems 130. In certain embodiments including a plurality of leakage manager systems 130, each of the leakage manager systems 130 is coupled to one of a plurality of power island managers 120. In some embodiments, functions of the leakage manager system 130 are distributed. In some embodiments, a single leakage manager system 130 is coupled to one or more power island managers 120. It will be appreciated that principles of the invention may apply to a circuit without power islands 110 or power island managers 120.

The power island 110 includes one or more logic gates 115. In an embodiment without the power island 110, the logic gate 115 may comprise any logic gate of the integrated circuit 100. The logic gate 115 of the exemplary embodiment comprises any logic circuitry such as an inverter, a NAND, NOR, exclusive-OR, and exclusive-NOR gate, as well as a storage cells such as a flip-flop and a latch. The logic gate 115 may comprise higher-level Boolean logic, including combinations of individual logic gates.

The logic gate 115 may be powered down to a "sleep mode" in conjunction with a sleep transistor (not shown), as described further herein. To minimize static leakage of the logic gate 115, the leakage manager system 130 generates a negative voltage 150 to be applied to the sleep transistor. Applying the negative voltage 150 to a gate of an NMOS sleep transistor coupled between the logic gate 115 and ground may reduce the static leakage of the logic gate 115. The leakage manager system 130 receives a negative voltage enable signal 140 and subsequently generates and transmits the negative voltage 150 to the power island 110. The negative voltage enable signal 140 may include other signals in addition to the negative voltage enable signal 140. The leakage manager system 130 determines whether to adjust the negative voltage 150. Based on the determination, the leakage manager system 130 adjusts the negative voltage 150, as described further herein.

Adjusting the negative voltage 150 applied to the sleep transistor minimizes static leakage of the logic gate 115. For example, static leakage varies based on parameters such as operating temperature, voltage fluctuations, and manufacturing variations. Therefore, application of a fixed negative voltage to the sleep transistor does not optimally minimize the static leakage of the logic gate 115. Furthermore, generating the negative voltage 150 "on chip" reduces component requirements external to the integrated circuit 100.

An alternative to reduce the static leakage of the logic gate 115 comprises multiple threshold voltage CMOS, in which one or more high threshold transistors are inserted in series with a low threshold logic gate 115. Switching the high threshold transistor "off" reduces the static leakage of the logic gate 115. However, the high threshold transistor requires extra manufacturing process steps for the integrated circuit 100 and slows down the speed of the logic gate 115 as compared to nominal threshold transistors. Providing the negative voltage 150 to a low threshold NMOS sleep transistor advantageously eliminates a requirement to provide high threshold sleep transistor, thereby reducing processing steps needed to manufacture the integrated circuit 100.

Figure 2:
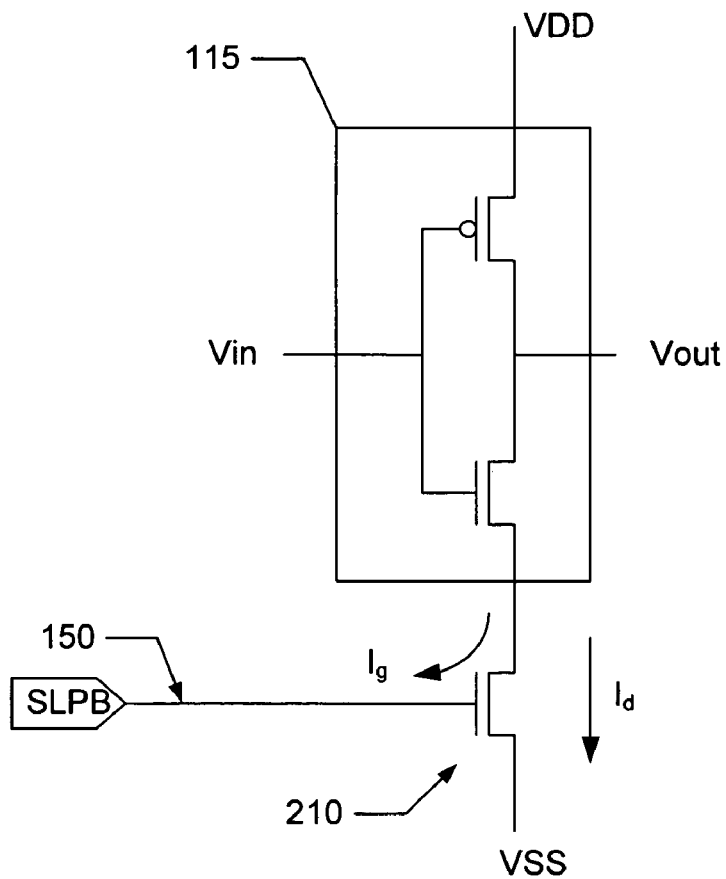
FIG. 2 is an illustration of a sleep transistor for minimizing static leakage of the logic gate of FIG. 1, in accordance with one embodiment of the invention.

FIG. 2 is an illustration of a sleep transistor 210 for minimizing static leakage of the logic gate 115 of FIG. 1, in accordance with one embodiment of the invention. In some embodiments, the sleep transistor 210 comprises an NMOS transistor cascaded in series with the logic gate (e.g., inverter) 115. Static leakage of the logic gate 115 passes through the sleep transistor 210 as a drain-source current (depicted as $I_d$) and/or as a drain-gate current (depicted as $I_g$). The static leakage of the logic gate 115 equals $I_d + I_g$ through the sleep transistor 210. The negative voltage (SLPB) 150 applied to the sleep transistor 210 may be used to control the static leakage of the logic gate 115 by regulating the drain-source current and the drain-gate current of the sleep transistor 210.

Figure 3:
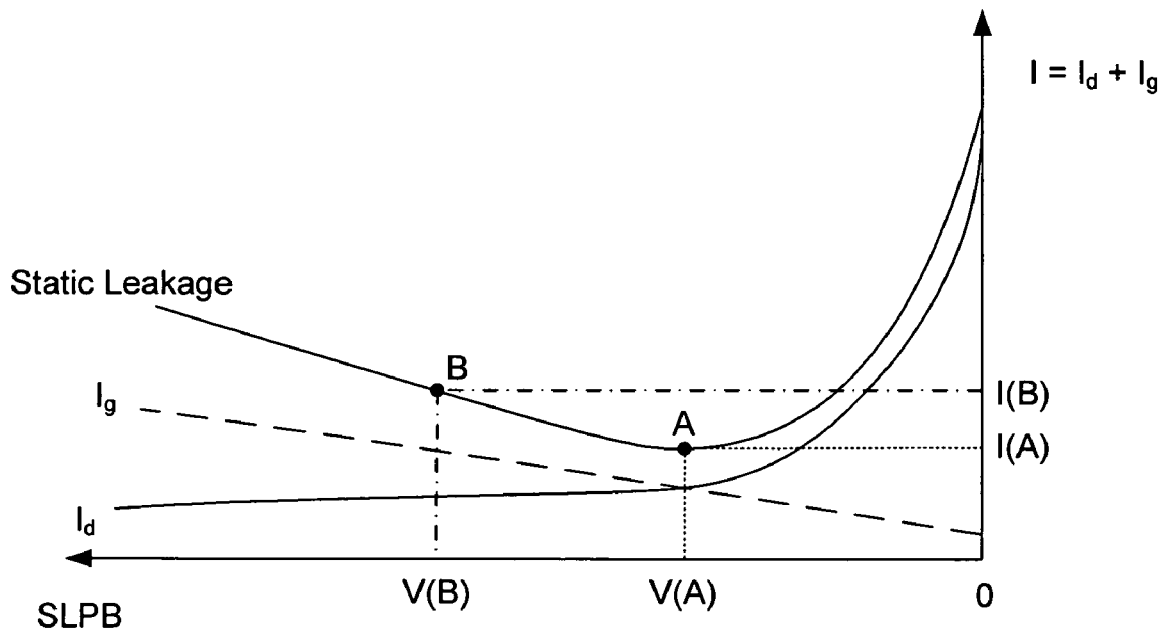
FIG. 3 is an illustration of a graph of static leakage of the logic gate of FIG. 2, for a range of negative voltage at the gate of the sleep transistor, in accordance with one embodiment of the invention.

FIG. 3 is an illustration of a graph of static leakage of the logic gate 115 of FIG. 2, for a range of negative voltage at the gate of the sleep transistor 210, in accordance with one embodiment of the invention. As the negative voltage (SLPB) 150 applied to the gate of the sleep transistor 210 becomes increasingly negative, the drain-source current $I_d$ of the sleep transistor 210 decreases. However, as the magnitude of the negative voltage 150 increases beyond a minimum leakage point A, for example to point B, the drain-gate current $I_g$ of the sleep transistor 210 exceeds the drain-source current $I_d$. As a result, the static leakage of the logic gate 115 increases. Accordingly, adjusting the negative voltage 150 to approximately V(A), corresponding to a substantial equality between the drain-source current $I_d$ and the drain-gate current $I_g$ at the minimum leakage point A, minimizes static leakage in the logic gate 115.

Figure 4:
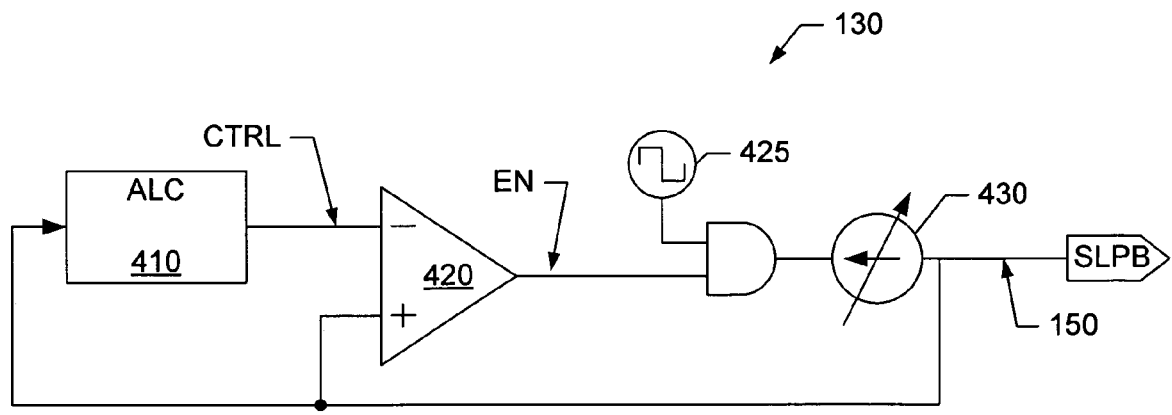
FIG. 4 is a block diagram of the leakage manager system for minimizing static leakage of the logic gate by application of the negative voltage of to the sleep transistor of FIG. 2, in accordance with one embodiment of the invention.

FIG. 4 is a block diagram of the leakage manager system 130 for minimizing static leakage of the logic gate 115 by application of the negative voltage of to the sleep transistor 210 of FIG. 2, in accordance with one embodiment of the invention. The leakage manager system 130 comprises an adaptive leakage controller (ALC) 410, a negative voltage regulator 420, and a charge pump 430. The charge pump 430 generates the negative voltage 150 (SLPB). The ALC 410 determines whether to adjust the negative voltage 150. The ALC 410 generates a signal (depicted as CTRL) depending on the determination. The negative voltage regulator 420 adjusts the negative voltage 150 depending on the CTRL signal.

As described further herein, the negative voltage regulator 420 of one embodiment generates an enable (EN) signal to the charge pump 430 to enable the charge pump 430 to increase the magnitude of the negative voltage 150 (i.e., to make the negative voltage 150 more negative). If the EN signal is low, an alternating signal from an oscillator 425 to the charge pump 430 is disabled, preventing the charge pump 430 from increasing the magnitude of the negative voltage 150. Alternatively, if the EN signal is high, the alternating signal from the oscillator 425 is enabled so that the charge pump 430 will increase the magnitude of the negative voltage 150. Because the negative voltage regulator 420 toggles the EN signal on or off depending on whether the ALC 410 determines to adjust the negative voltage 150, the leakage manager system 130 maintains the negative voltage 150 at a particular negative voltage to minimize static leakage of the logic gate 115.

Figure 5:
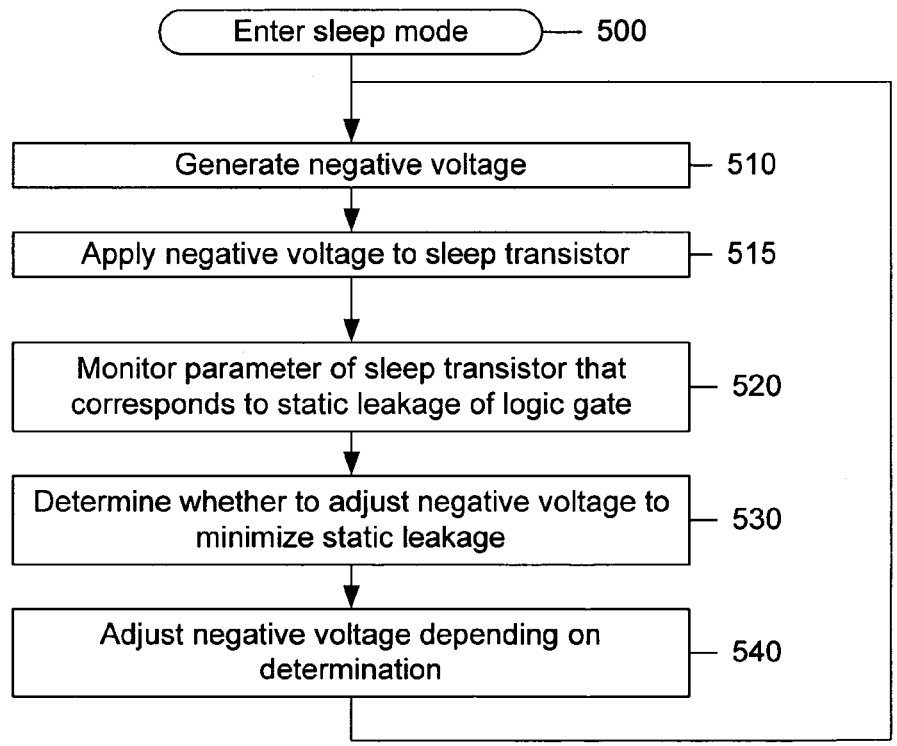
FIG. 5 is an illustration of a method to minimize the static leakage of the logic gate of FIG. 2, in accordance with one embodiment of the invention.

FIG. 5 is an illustration of a method to minimize the static leakage of the logic gate 115 of FIG. 2, in accordance with one embodiment of the invention. At step 500, the CPU 105 (FIG. 1) enters sleep mode. At step 510, the charge pump 430 (FIG. 4) generates the negative voltage 150. At step 515, the charge pump 430 applies the negative voltage 150 to the sleep transistor 210 (FIG. 2). At step 520, the ALC 410 (FIG. 4) may monitor one or more parameters of the sleep transistor 210 corresponding to the static leakage of the logic gate 115. The ALC 410 may monitor the sleep transistor 210 directly, or may monitor one or more emulated sleep transistors, as described further with respect to FIGS. 6-8.

At step 530, the ALC 410 determines whether to adjust the negative voltage 150 to minimize static leakage. If the ALC 410 determines to adjust the negative voltage 150, the ALC 410 generates the CTRL signal to the negative voltage regulator 420 (FIG. 4). At step 540, the negative voltage regulator 420 adjusts the negative voltage 150 based on the CTRL signal.

In one embodiment, the negative voltage regulator 420 continuously adjusts the negative voltage 150. In another embodiment, the negative voltage regulator 420 periodically adjusts the negative voltage 150.

The leakage manager system 130 adjusts the negative voltage 150 to minimize the static leakage of the logic gate 115, even if the static leakage varies due to effects such as temperature variation, voltage fluctuation, or manufacturing process variation. The leakage manager system 130 may advantageously be wholly integrated into the integrated circuit 100, obviating components external to the integrated circuit 100 to generate the negative voltage 150. Further, the leakage manager system 130 may advantageously be utilized in the integrated circuit 100 comprising single threshold transistor logic, so that manufacturing of the integrated circuit 100 is simplified.

FIGS. 6-10 illustrate further detail of embodiments of the leakage manager system 130 of FIG. 4.

Figure 6:
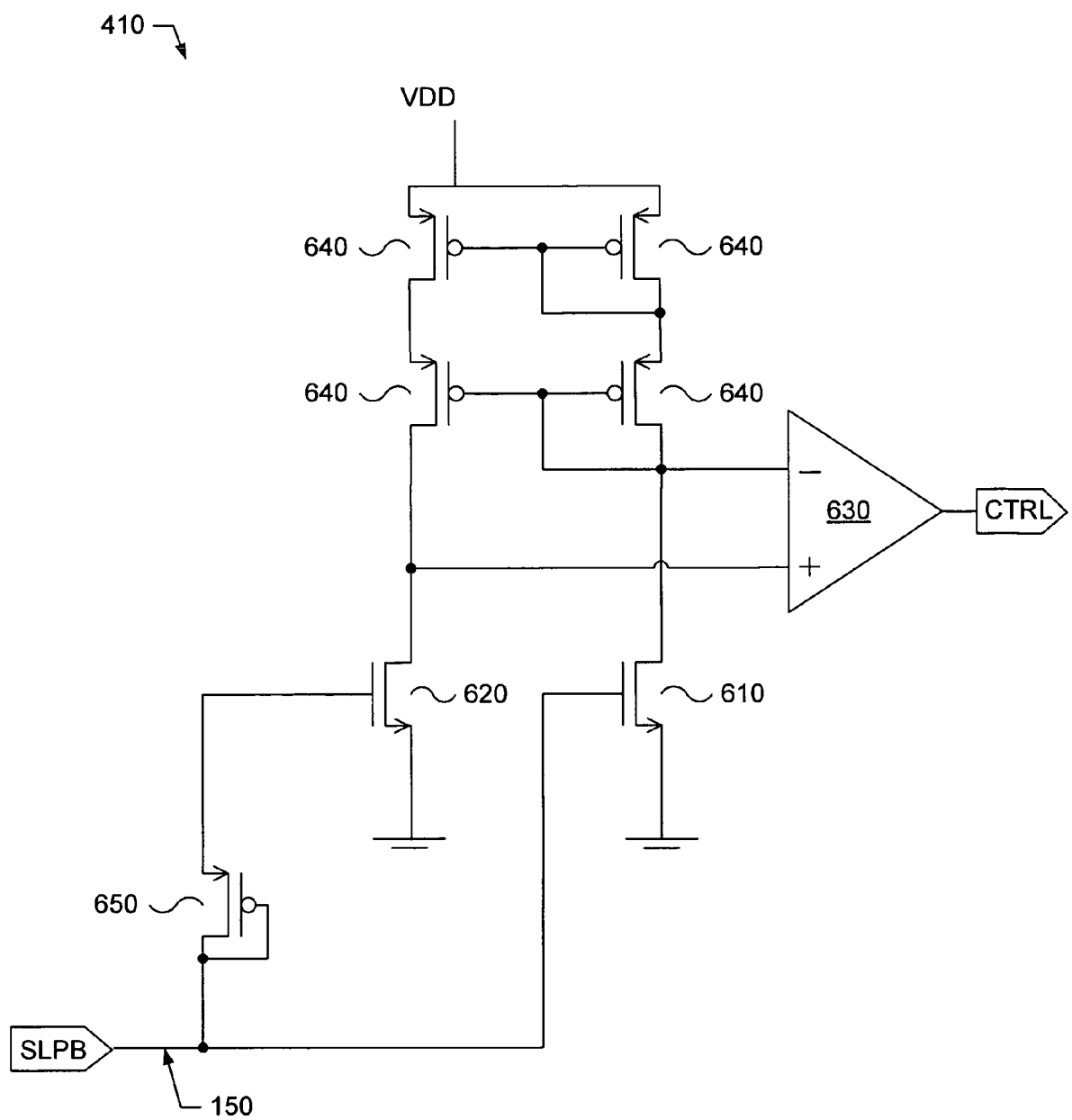
FIG. 6 is an illustration of the adaptive leakage controller (ALC) of FIG. 4, in accordance with one embodiment of the invention.

FIG. 6 is an illustration of the adaptive leakage controller (ALC) 410 of FIG. 4, in accordance with one embodiment of the invention. The ALC 410 of this embodiment comprises a first emulated sleep transistor 610, a second emulated sleep transistor 620, a differential (operational) amplifier 630, bias transistors 640, and a voltage offset transistor 650. It will be appreciated that the ALC 410 of this embodiment comprises analog circuitry to continuously determine whether to adjust the negative voltage 150 of FIG. 4.

It will also be appreciated that although FIG. 6 depicts the bias transistors 640 as PMOS transistors with gate connected to drain to provide a resistive voltage drop across the bias transistors 640, the bias transistors 640 may comprise resistors. In the exemplary embodiment with PMOS bias transistors 640, matching between the several bias transistors 640 ensures substantially identical operation of the bias transistors 640. The voltage offset transistor 650 of the exemplary embodiment similarly comprises a PMOS transistor with gate connected to drain to provide a resistive voltage drop across the voltage offset transistor 650. Alternatively, the voltage offset transistor 650 may comprise a resistor.

In FIG. 6, the negative voltage 150 (SLPB) is applied to a gate of the first emulated sleep transistor 610. The negative voltage 150 correspondingly produces a first current through the first emulated sleep transistor 610. The first current may comprise drain-gate current and/or drain-source current. The first current through the first emulated sleep transistor 610 is in proportion to the static leakage of the logic gate 115. The first current creates a first voltage drop across the bias transistors (resistances) 640 at a drain of the first emulated sleep transistor 610. The first voltage drop is sensed at a negative input of the differential amplifier 630.

With respect to the second emulated sleep transistor 620, the resistance of the voltage offset transistor 650 reduces the magnitude of the negative voltage 150 (SLPB) by a voltage offset. A gate of the second emulated sleep transistor 620 receives the negative voltage 150 plus the voltage offset. The negative voltage 150 plus the voltage offset produces a second current through the second emulated sleep transistor 620. The second current may comprise drain-gate current and/or drain-source current. The second current creates a second voltage drop across the bias transistors (resistors) 640 at a drain of the second emulated sleep transistor 620. The second voltage drop is sensed at a positive input of the differential amplifier 630.

In operation, the gate of the second emulated sleep transistor 620 operates at a slight voltage offset as compared to the gate of the first emulated sleep transistor 610, because of the voltage offset transistor 650. Referring to FIG. 3, the voltage offset may be represented by the voltage offset between points A and B, or V(B)—V(A). As a result of the voltage offset, the minimum leakage point A may be detected by adjusting the negative voltage 150 so that I(B) is substantially equal to I(A). It will be appreciated that operating parameters of the voltage offset transistor 650 influence the magnitude of the voltage offset. The operating parameters may be based on such considerations as noise on the negative voltage 150, for example.

In principle of operation with respect to FIG. 3, if the magnitude of the negative voltage 150 produces a first current I(B) in the first emulated sleep transistor 610 corresponding to point B, and the negative voltage 150 plus the voltage offset produces a second current I(A) in the second emulated sleep transistor 620 corresponding to point A, then the differential amplifier 630 will generate the CTRL signal so that the magnitude of the negative voltage 150 will be adjusted until I(A) substantially equals I(B). Alternatively, if the negative voltage 150 is such that the first emulated sleep transistor 610 and the second emulated sleep transistor 620 produce substantially equal currents, so that I(A)=I(B), then the differential amplifier 630 will maintain the present value of the CTRL signal. The resulting operating point will be a negative voltage which is offset from the ideal operating point by a value equal to one half the voltage offset produced by the current though the voltage offset transistor 650. If gate leakage is negligible, there may be no inflection in the leakage vs. gate voltage curve of FIG. 3. In this case, the CTRL signal will decrease to its minimum value, causing the charge pump 430 (FIG. 4) to operate at its most negative voltage.

Figure 9:
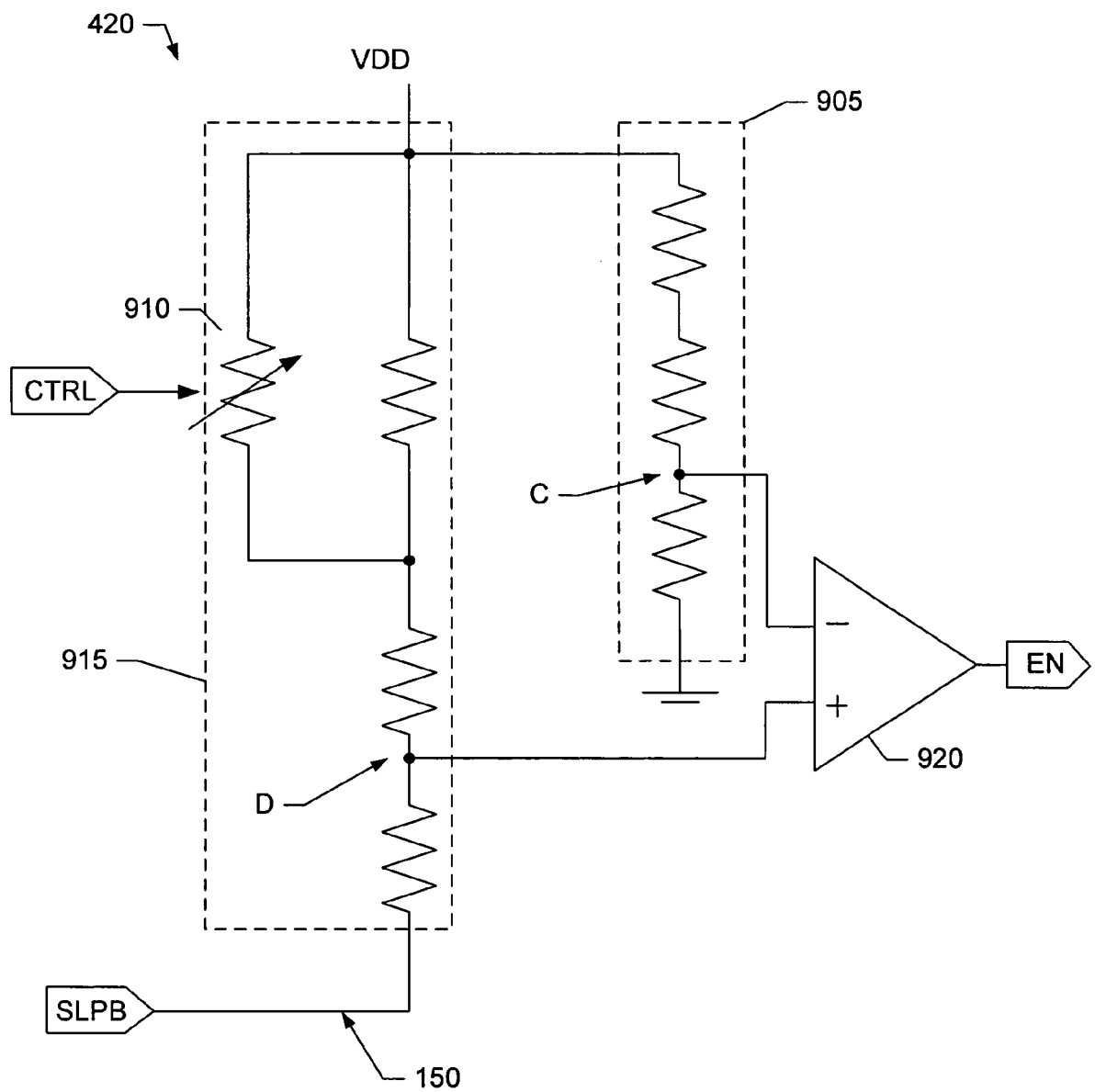
FIG. 9 is an illustration of the negative voltage regulator of FIG. 4 for minimizing static leakage of the logic gate, in accordance with one embodiment of the invention.

In conjunction with the negative voltage regulator 420 of FIG. 9, the ALC 410 of this embodiment advantageously minimizes static leakage of the logic gate 115 by continuously controlling the negative voltage 150 to approximately the minimum leakage point A of FIG. 3.

Figure 7:
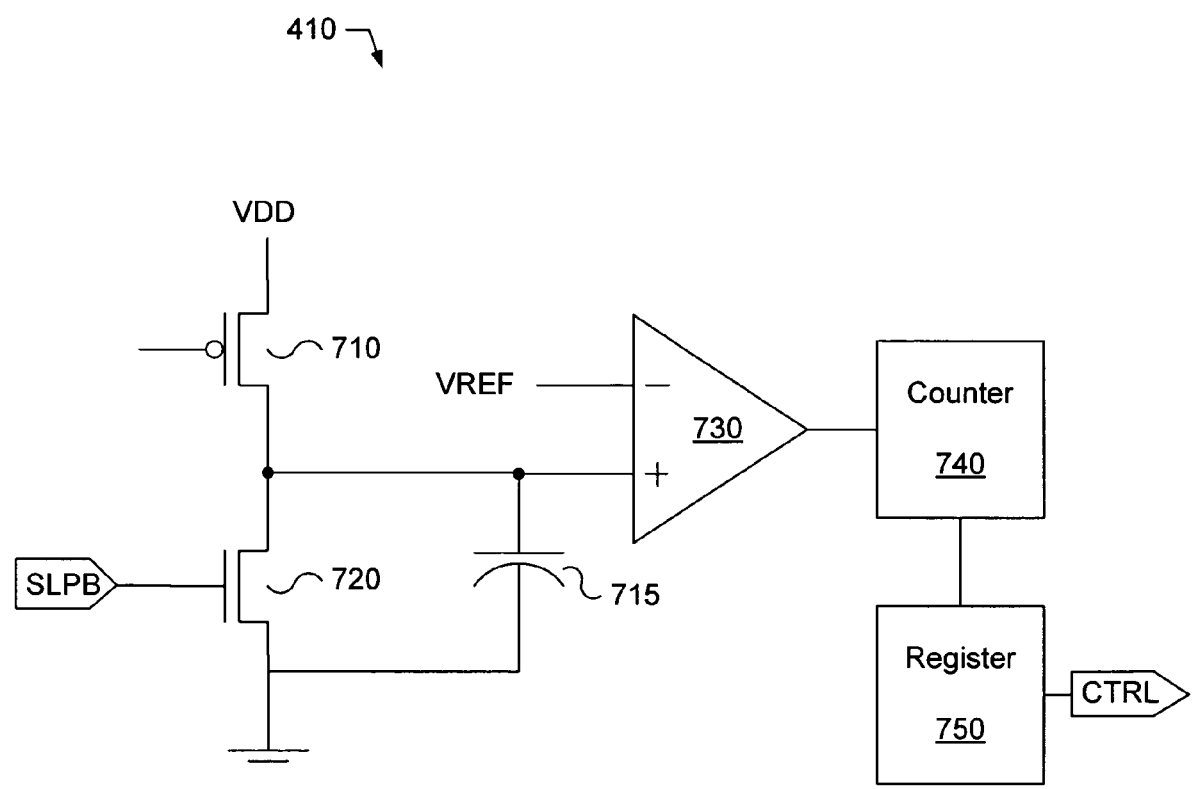
FIG. 7 is an illustration of the ALC of FIG. 4, in accordance with an alternative embodiment of the invention.

FIG. 7 is an illustration of the ALC 410 of FIG. 4, in accordance with an alternative embodiment of the invention. The ALC 410 of this embodiment comprises a charging transistor 710, a capacitor 715, an emulated sleep transistor 720, a comparator 730, a counter 740, and a register 750. The charging transistor 710 is switched by a controller (not shown) to charge the capacitor 715 to a positive supply voltage (e.g., VDD). The controller may also switch the charging transistor 710 so that the capacitor 715, once charged, may discharge through the emulated sleep transistor 720. The comparator 730, the counter 740, and the register 750 comprise a control circuit to measure a time needed to discharge the capacitor 715 to a predetermined value VREF. A state logic machine (not shown) coupled to the register 750 may compare values stored in the register 750, as described with respect to FIG. 8.

In this embodiment of the ALC 410, the maximum discharge time for the capacitor 715 corresponding to the lowest value of static leakage is used to generate a digital value for the CTRL signal to the negative voltage regulator 420 (FIG. 4). The ALC 410 periodically updates the CTRL signal if the ALC 410 determines to adjust the negative voltage 150. The operation of the ALC 410 of this embodiment is described with respect to FIG. 8.

Figure 8:
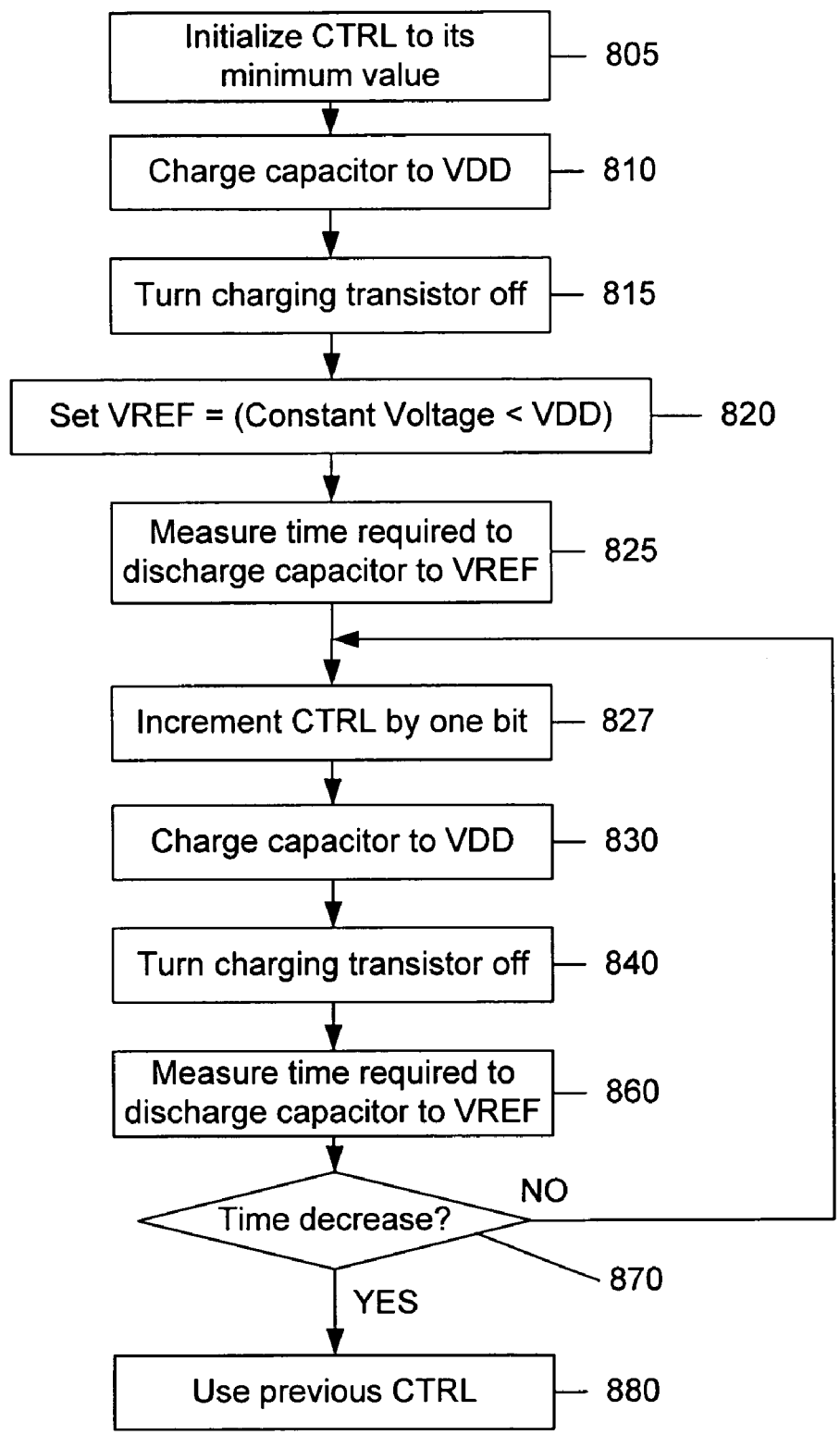
FIG. 8 is an illustration of a method for minimizing static leakage of the logic gate of FIG. 2, in accordance with the embodiment of the ALC of FIG. 7.

FIG. 8 is an illustration of a method for minimizing static leakage of the logic gate 115 of FIG. 2, in accordance with the embodiment of the ALC 410 of FIG. 7. In overview, the method comprises charging the capacitor 715 to the positive supply voltage VDD, discharging the capacitor at a rate in proportion to the static leakage of the logic gate 115 via the emulated sleep transistor 720, and adjusting the negative voltage 150 to minimize the rate of discharge of the capacitor 715. The negative voltage 150 that corresponds to minimum current through the emulated sleep transistor 720 (i.e., minimum static leakage) minimizes the discharge rate of the capacitor 715 and maximizes the time to discharge the capacitor 715.

At step 805, the CTRL signal is initialized to its minimum value. Setting the CTRL signal to its minimum value directs the negative voltage regulator 420 to drive the magnitude of the sleep signal SLPB 150 to its minimum value. At step 810, the controller switches the charging transistor 710 so that the capacitor 715 is charged to VDD. At step 815, the charging transistor 710 is switched off so that the capacitor 715 may discharge through the emulated sleep transistor 720. At step 820, the reference voltage VREF is set to a constant voltage which is less than VDD (e.g. VDD/2). At step 825, the comparator 730 generates an output to the counter 740 after the capacitor 715 discharges to VREF. The counter 740 determines a time required to discharge the capacitor 715 to VREF. The register 750 stores a count (i.e., time) of the counter 740.

At step 827, the CTRL signal is incremented by one bit. At step 830, the controller switches the charging transistor 710 so that the capacitor 715 is again charged to VDD. At step 840, the charging transistor 710 is switched off. At step 860, the comparator 730 generates an output to the counter 740 after the capacitor 715 discharges to VREF. The counter 740 determines the time required to discharge the capacitor 715 with the new value of the CTRL signal and the corresponding SLPB signal.

At step 870, the state logic machine compares the value of the register 750 for the current pass through steps 830-860 (i.e., the time required to discharge the capacitor 715 to VREF for the new value of the CTRL signal and the SLPB signal) to the value of the register 750 for the previous pass through steps 830-860. If the value of the register 750 for the current pass did not decrease relative to the value of the register 750 for the previous pass, then the new value of the CTRL signal corresponds to a lower value of static leakage through the emulated sleep transistor 720. In this case, the method returns to step 827 to further increment the CTRL signal and measure the time required to discharge the capacitor 715. Alternatively, at step 870, if the time required to discharge the capacitor 715 decreased in the current pass, corresponding to a higher value of static leakage through the emulated sleep transistor 720, then the previously stored value of the register 750 corresponds to the lowest value of static leakage through the emulated sleep transistor 720. The value of the CTRL signal corresponding to minimal static leakage is used to control the negative voltage regulator 420 to generate the appropriate setting for the negative voltage 150.

One advantage of the embodiment of the digital ALC 410 of FIGS. 7-8 is that the CTRL signal comprises a digital signal. The digital CTRL signal may be routed via the control signal 140 to multiple leakage managers 130 of FIG.

1. For example, because silicon is an excellent thermal conductor, it may be advantageous to utilize a single digital ALC 410 with leakage managers 130 and power island managers 120. Each of the multiple power island managers 120 of this embodiment comprise the negative voltage regulator 420 and the charge pump 430, so that the functions of the leakage controller system 130 may be distributed as needed across the integrated circuit 100.

FIG. 9 is an illustration of the negative voltage regulator 420 of FIG. 4 for minimizing static leakage of the logic gate 115, in accordance with one embodiment of the invention. The negative voltage regulator 420 includes an interface to receive the negative voltage 150, a first voltage divider 905, a second voltage divider 915, and a comparator 920. In one embodiment, the first voltage divider 905 comprises a series of stacked PMOS transistors (not shown) with bulk tied to source. It will be appreciated, for example, that a series of three equivalent stacked PMOS transistors with bulk tied to source provide a divide-by-3 voltage divider in the first voltage divider 905. It will further be appreciated that the first voltage divider 905 may comprise any ratio of division. The first voltage divider 905 provides a fixed voltage reference (e.g., point C) with respect to a positive voltage source (e.g., VDD). The fixed voltage reference of this embodiment is coupled to a negative terminal of the comparator 920.

Similarly, a series of three equivalent stacked PMOS transistors with bulk tied to source provide a divide-by-3 voltage divider in the fixed resistances of the second voltage divider 915. It will be appreciated that the second voltage divider 915 may comprise any ratio of division. The second voltage divider 915 of this embodiment is coupled to a positive terminal of the comparator 920.

In an embodiment in conjunction with the analog CTRL signal generated by the ALC 410 of FIG. 6, a variable resistor 910 of the second voltage divider 915 allows the second voltage divider 915 to generate a variable voltage reference (e.g., point D) depending on the negative voltage 150 and a received signal (CTRL) generated by the ALC 410. The variable resistor 910 may comprise a transistor circuit. Depending on the CTRL signal, the variable resistor 910 varies between high impedance and low impedance.

In conjunction with the digital ALC 410 of FIGS. 7-8, the variable resistor 910 of the second voltage divider 915 comprises a switched resistor network controlled by the digital CTRL signal. The variable resistor 910 of this embodiment may comprise two or more switched resistors. The variable resistor 910 may also comprise two or more PMOS transistors with bulk tied to source.

In operation, the negative voltage regulator 420 adjusts the negative voltage 150 depending on a comparison between the fixed voltage reference (point C) and the variable voltage reference (point D). The comparator 920 may generate an enable (EN) signal to enable the charge pump 430 (FIG. 4) to increase the magnitude of the negative voltage 150. If the EN signal is low, the alternating signal from the oscillator 425 (FIG. 4) to the charge pump 430 is disabled, preventing the charge pump 430 from increasing the magnitude of the negative voltage 150. If the EN signal is high, the alternating signal from the oscillator 425 is enabled so that the charge pump 430 will increase the magnitude of the negative voltage 150. Therefore, depending on the CTRL signal from the ALC 410, the comparator 920 will control the charge pump 430 to increase the magnitude of the negative voltage 150 or allow it to decrease.

Figure 10:
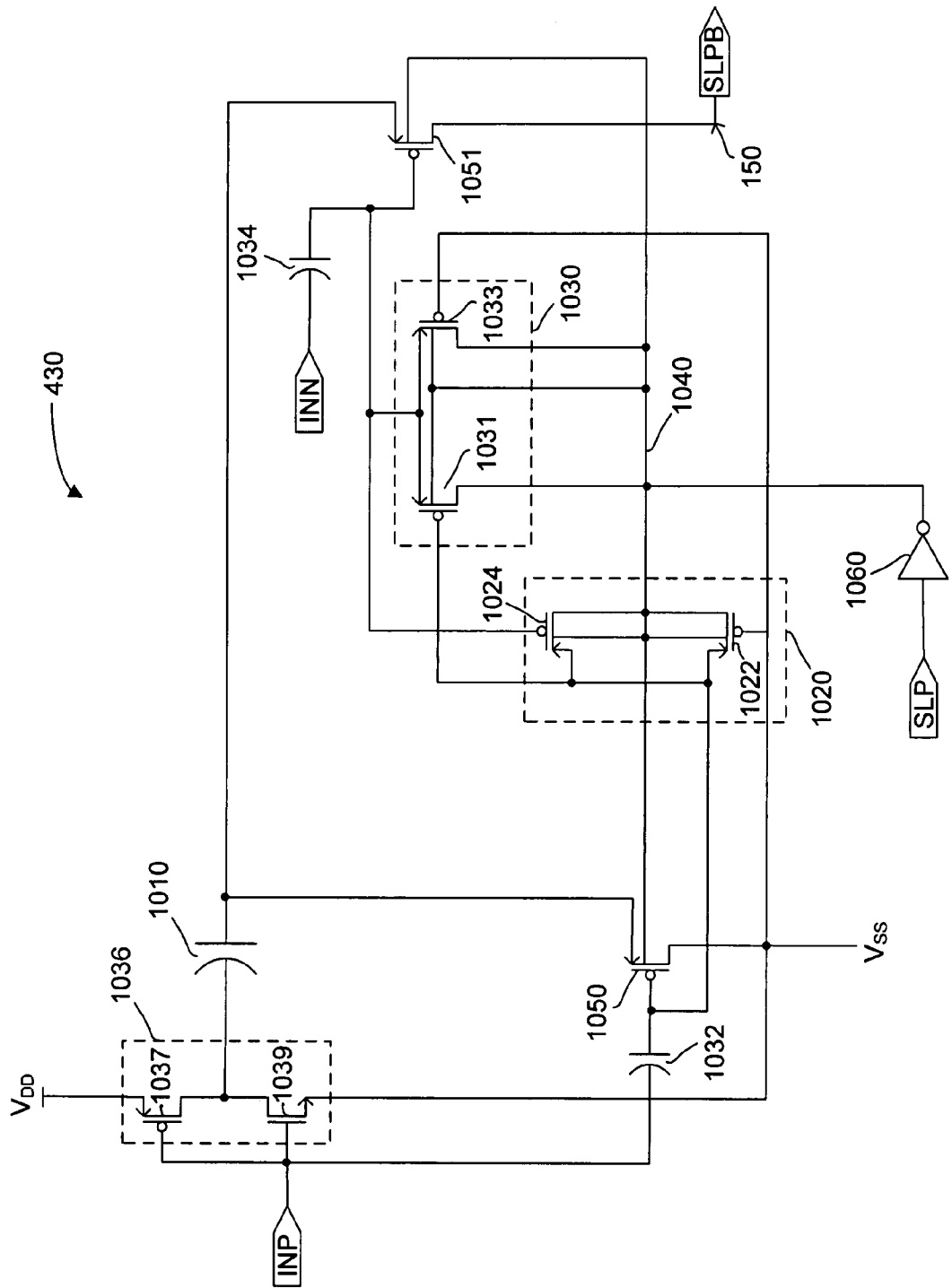
FIG. 10 is an illustration of the charge pump of FIG. 4 for minimizing static leakage, in accordance with one embodiment of the invention.

FIG. 10 is an illustration of the charge pump 430 of FIG. 4 for minimizing static leakage, in accordance with one embodiment of the invention. The charge pump 430 comprises an interface to receive a positive voltage (e.g., VDD), a pump capacitor 1010, a positive cross-coupled pass gate 1020 that in the illustrated example includes two PMOS transistors 1022 and 1024, and a negative cross-coupled pass gate 1030 that in the illustrated example includes two PMOS transistors 1031 and 1033. The pump capacitor 1010 is coupled to the positive voltage VDD at a first terminal of the pump capacitor 1010.

The illustrated charge pump circuit also includes two capacitances 1032 and 1034. A first of the two terminals of the capacitance 1032 receives an alternating signal (INP). Similarly, a first of the two terminals of the capacitance 1034 receives a complement of the alternating signal (INN).

The illustrated charge pump circuit also includes first and second PMOS switches 1050 and 1051. A gate of each of the switches 1050 and 1051 is electrically connected to a different one of the second terminals of the two capacitances 1032 and 1034. Also, the drain of the second switch 1051 is located at negative output terminal of the illustrated circuit, and one of the terminals of the pump capacitor 1010 is electrically connected to both sources of the switches 1050 and 1051. The other terminal of the pump capacitor 1010 is electrically connected to the output of an inverter 1036. The input of the inverter 1036 receives the signal INP. Also, the inverter 1036 includes a PMOS transistor 1037 and an NMOS transistor 1039.

In the illustrated charge pump circuit, one of the terminals of the negative pass gate 1030 is electrically connected to the same terminal of the capacitance 1034 that the gate of the second switch 1051 is electrically connected to. An opposite terminal of the negative pass gate 1030 is electrically connected to a virtual ground 1040. Similarly, one of the terminals of the positivepass gate 1020 is electrically connected to the same terminal of the capacitance 1032 that the gate of the first switch 1050 is electrically connected to. An opposite terminal of the positive pass gate 1020 is electrically connected to the virtual ground 1040.

The positive cross-coupled pass gate 1020 of this embodiment is capacitively coupled to the alternating signal from the oscillator 425 (FIG. 4). The positive cross-coupled pass gate 1020 couples a second terminal of the pump capacitor 1010 to the virtual ground 1040 via the first PMOS switch 1050, to charge the pump capacitor 1010 based on the alternating signal. The negative cross-coupled pass gate 1030 is capacitively coupled to a complement of the alternating signal from the oscillator 425. The negative cross-coupled pass gate 1030 discharges the pump capacitor 1010 by coupling the second terminal of the pump capacitor 1010 to the negative output terminal (e.g., the negative voltage 150) via the second PMOS switch 1051, based on the complement of the alternating signal. The negative output terminal supplies the negative voltage 150 to the sleep transistor 210 to control the static leakage of the logic gate 115 of FIG. 2.

It will be appreciated that the cross-coupled pass gates 1020 and 1030 comprise PMOS transistors with ohmic contacts to tie wells of the PMOS transistors together. An interface to an SLP signal is configured to switch the substrate between the positive reference (e.g., VDD) and the virtual ground 1040. The SLP signal, which is received at the input of an inverter 1060, is typically activated on exiting the sleep mode to prevent a power supply that generates VDD from being shorted to ground through the PMOS switches 1050 and 1051, and ensures that any P-N junctions in the wells are not forward biased. There is no current flow from the transistors to the substrate, since the substrate is always at an equal or higher potential than the source and drain of the PMOS transistors. The SLP signal also disables the charge pump 430.

The leakage manager system 130, comprising the adaptive leakage controller 410, the negative voltage regulator 420, and the charge pump 430 of FIGS. 4-10, minimizes the static leakage of the logic gate 115, even if the static leakage varies due to effects such as temperature variation, voltage fluctuation, or manufacturing process variation. The leakage manager system 130 may be wholly integrated into the integrated circuit 100, obviating components external to the integrated circuit 100. Further, the leakage manager system 130 may advantageously be utilized in the integrated circuit 100 comprising single threshold transistor logic, simplifying manufacturing of the integrated circuit 100.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. A charge pump circuit for minimizing static leakage of a logic gate, comprising:

two capacitances, each having first and second terminals, the first terminal of one of the capacitances at a first circuit input for receiving an alternating signal, the first terminal of the other of the capacitances at a second circuit input for receiving a complement of the alternating signal;

first and second PMOS switches, a gate of each said switches electrically connected to a different one of the second terminals of said two capacitances;

a pump capacitor having first and second terminals, the first terminal electrically connected to both sources of the switches;

an inverter having an input and an output, said output of the inverter electrically connected to said second terminal of the pump capacitor, said input of the inverter receiving said alternating signal;

a negative pass gate having at least two terminals, a first terminal of said negative pass gate electrically connected to the second terminal of the other of the capacitances, and a second terminal of said negative pass gate electrically connected to virtual ground; and a positive pass gate having at least two terminals, a first terminal of said positive pass gate electrically connected to the second terminal of the one of the capacitances, and a second terminal of said positive pass gate electrically connected to said virtual ground, the drain of the second switch at a negative output, the negative output configured to supply a negative voltage to a sleep transistor to control static leakage of the logic gate.

2. The charge pump as claimed in claim 1, wherein the pass gates comprise PMOS transistors.

3. The charge pump as claimed in claim 1, wherein the pass gates are cross-coupled pass gates.

4. The charge pump as claimed in claim 1, wherein the drain of the first switch is electrically connected to ground.

5. The charge pump as claimed in claim 1, further comprising an inverter coupled to said virtual ground, said inverter being configured to apply a positive voltage to said virtual ground to inhibit the charge pump.

6. The charge pump as claimed in claim 1, wherein said virtual ground comprises a substrate of an integrated circuit.

* * * * *